(12) United States Patent
Muthiah et al.

(10) Patent No.: US 12,387,020 B2
(45) Date of Patent: Aug. 12, 2025

(54) DIE LOCATION BASED LOGICAL BLOCK FORMATION AND HANDLING

(71) Applicant: Western Digital Technologies, Inc., San Jose, CA (US)

(72) Inventors: Ramanathan Muthiah, Karnataka (IN); Ankur Agrawal, Uttar Pradesh (IN); Muralitharan Jayaraman, Karnataka (IN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 739 days.

(21) Appl. No.: 17/659,809

(22) Filed: Apr. 19, 2022

(65) Prior Publication Data

US 2023/0334206 A1 Oct. 19, 2023

(51) Int. Cl.
| | | |
|---|---|---|
| *G11C 7/04* | (2006.01) | |
| *G06F 12/02* | (2006.01) | |
| *G06F 30/327* | (2020.01) | |
| *G06F 30/392* | (2020.01) | |

(52) U.S. Cl.
CPC ........ *G06F 30/327* (2020.01); *G06F 12/0246* (2013.01); *G06F 30/392* (2020.01)

(58) Field of Classification Search
CPC ... G06F 30/327; G06F 30/392; G06F 12/0246
See application file for complete search history.

(56) References Cited

U.S. PATENT DOCUMENTS

| | | | |
|---|---|---|---|
| 8,472,274 B2 | 6/2013 | Fai et al. | |
| 9,489,146 B2 | 11/2016 | Erez et al. | |
| 9,891,859 B1* | 2/2018 | Vogan | G06F 3/0647 |
| 10,642,510 B2 | 5/2020 | Sharon et al. | |
| 10,831,396 B2 | 11/2020 | Fisher et al. | |
| 2013/0145076 A1* | 6/2013 | Chiueh | G06F 12/0246 |
| | | | 711/E12.008 |
| 2018/0374547 A1 | 12/2018 | Yang et al. | |
| 2019/0043566 A1* | 2/2019 | Wu | G11C 7/04 |
| 2023/0153237 A1* | 5/2023 | Zhang | G06F 12/0246 |
| | | | 707/813 |

FOREIGN PATENT DOCUMENTS

WO 2018205085 A1 11/2018

* cited by examiner

*Primary Examiner* — Min Huang
(74) *Attorney, Agent, or Firm* — ARENTFOX SCHIFF LLP

(57) ABSTRACT

Aspects of a storage device are provided for efficient handling of logical metablock formation based on a heat distribution within the storage device. The storage device includes a plurality of memory dies each including a physical block, and a controller which forms a logical metablock from the physical blocks based on a location of each of the memory dies with respect to the controller. The controller stores a mapping of heat credit points to each of the physical blocks, where each of the heat credit points are associated with a respective heat level. The controller forms logical metablocks from the physical blocks based on the mapping. For instance, the controller forms different logical metablocks from physical blocks based on respective heat levels associated with memory dies including those blocks. As a result, efficient logical block formation may be achieved without significant complexity in firmware implementation.

20 Claims, 10 Drawing Sheets

| Plane | Block | Heat Credit Points |
|---|---|---|
| 0 | 0 | h1 |
| 0 | 1 | h2 |
| 0 | 2 | h3 |
| 0 | 3 | h4 |
| ... | ... | ... |
| 1 | 0 | h48 |
| 1 | 1 | h49 |
| 1 | 2 | h50 |
| 1 | 3 | h51 |
| ... | ... | ... |

□ Heat Level 1  ▨ Heat Level 2  ▨ Heat Level 3  ▨ Heat Level 4

FIG. 7

DIE LOCATION BASED LOGICAL BLOCK FORMATION AND HANDLING

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

Typical flash storage devices are impacted by temperature zones. The components in a non-volatile memory, such as NAND memory dies, are sensitive to temperature changes in the environment in which they are functioning. A flash storage device may have many temperature-sensitive components, and generally the most temperature-sensitive component becomes the bottleneck of the entire system. For example, some dies may be subject to more heat than other dies, causing these former dies to impact the performance of the device.

SUMMARY

One aspect of a storage device is disclosed herein. The storage device includes a plurality of memory dies each including a physical block, and a controller configured to form a logical metablock from the physical blocks based on a location of each of the memory dies with respect to the controller.

Another aspect of a storage device is disclosed herein. The storage device includes a plurality of memory dies and a controller. Each of the plurality of memory dies includes a plurality of physical blocks. The controller is configured to form a first logical metablock from multiple ones of the physical blocks based on a first heat level associated with one of the memory dies, and to form a second logical metablock from other multiple ones of the physical blocks based on a second heat level associated with another one of the memory dies, where the first heat level is different than the second heat level.

A further aspect of a storage device is disclosed herein. The storage device includes a plurality of memory dies and a controller. Each of the plurality of memory dies includes a plurality of physical blocks. The controller is configured to store a mapping of heat credit points to each of the physical blocks, and to form a logical metablock from multiple ones of the physical blocks based on the mapping.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIG. 7 is a conceptual diagram illustrating an example of a memory die including blocks of different heat levels.

DETAILED DESCRIPTION

Figure 1:
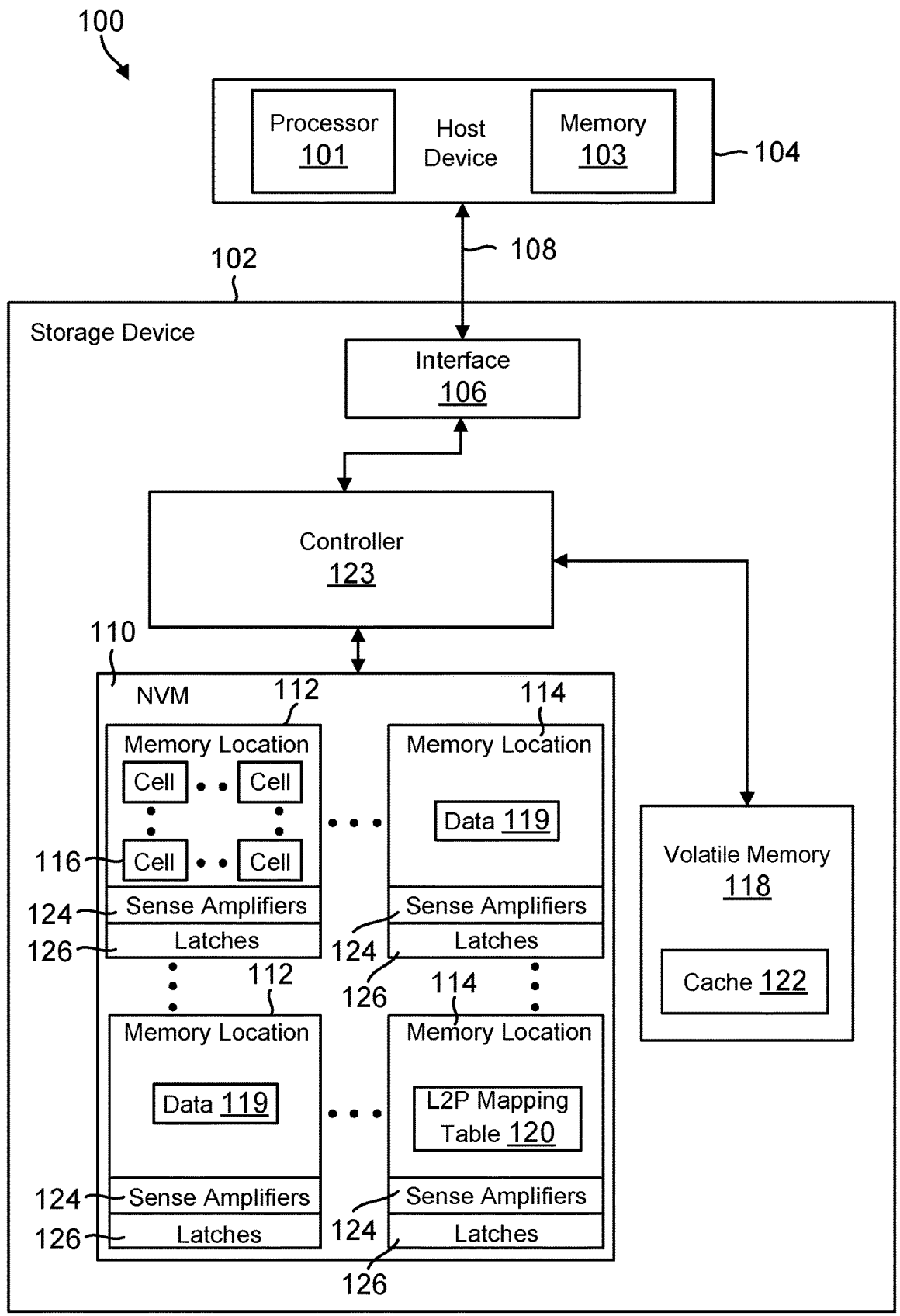
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Generally, storage devices are subject to different temperature sensitivities. For instance, in a storage device with multiple memory dies (e.g., a system on a chip (SoC)), some dies may be more temperature-sensitive than other dies. As an example, the former dies may be closer to an Application-Specific Integrated Circuit (ASIC) that stores a controller of the storage device, or to some other heat-intensive circuit such as a power management integrated circuit (PMIC), than the latter dies in the SoC. Since some memory dies may be closer to heat generating components while others may be farther away from these components, different dies may have different temperatures at which point functionality is impacted (e.g., the higher the temperature, the lower the die's reliability or health over time). Other differences in temperature sensitivity may be due to mechanical components; for example, some NAND packages may have high ambient thermal resistance while other NAND packages may be positioned in a manner that gives rise to more heat (e.g., closer to the surface of a table on which the storage device lies). As a result, various dies or blocks in NAND may potentially cause a bottleneck in firmware practices such as temperature throttling or other situations that typically involve a uniform approach in handling dies or blocks. For example, if the storage device includes a single temperature sensor that triggers temperature throttling in response to the temperature of a cooler block in a corner of the storage device away from the ASIC, the temperature throttling may not take into account the hotter blocks that are closer to the ASIC. Therefore, it would be helpful to optimize storage functionality to address this difference in temperature sensitivity between memory dies or blocks.

In one approach, the controller may identify higher temperature and lower temperature physical blocks at different physical locations of a memory die. For example, certain regions of a SoC including multiple memory dies may be more affected by heat (e.g., generated by the ASIC including the controller or emitted by some other component) than other regions of the SoC, and a heat gradient may be obtained across the different regions (e.g., in response to readings from temperature sensors, radar, etc.). Blocks in regions at the higher end of the heat gradient may be more impacted by heat and thus have a higher temperature than blocks in regions at the lower end of the heat gradient which thus have a lower temperature. Such higher temperature and lower temperature blocks may be referred to throughout this disclosure as "hot" blocks and "cold" blocks, respectively. The controller may identify these hot and cold blocks respectively in the different regions and apply them for different purposes. In one example, the controller may store important control structures containing boot information and internal file system information in cold blocks, which have higher data retention than hot blocks due to the latter blocks having lower endurance resulting from larger thermal energy impact to these blocks. In another example, the controller may not allocate hot blocks for more important data requiring high data reliability; alternatively, the controller may allocate hot blocks for less important data requiring less data reliability. Thus, the controller may address the heat spread between memory dies or blocks while improving memory health in response to writing more important and less important data to cold blocks and hot blocks, respectively.

However, when the controller identifies different physical blocks as hot or cold blocks, the logical blocks associated with these physical blocks may be impacted. For instance, logical blocks may be initially associated with a physical block in each of multiple memory dies (i.e., as logical metablocks), and therefore subsequent identification of the heat spread between such physical blocks may lead to relinking of the logical blocks to different block numbers in different dies. Typically, when the controller links logical metablocks (LBs) to physical blocks (PBs) in different memory dies, the controller associates a corresponding PB in each die. For example, the controller may initially link or allocate a logical metablock LB0 to a physical block PB0 in each of four memory dies D0-3 of the storage device such that LB0 is associated with four PB0s across dies. However, if the heat gradient or distribution changes across these different dies and blocks (e.g., due to some of these blocks being closer to the ASIC including the controller while others of these blocks are farther from the ASIC), a single LB may end up being inefficiently linked to hot and cold blocks. For instance, in the example above, after the controller forms logical metablock LB0 from the PB0s in D0-3, the controller may later determine that PB0 in one of the dies D0 happens to be a hot block while the PB0s in the other dies D1-D3 happen to be cold blocks. To correct the logical metablock, the controller may relink LB0 to a different physical block (e.g., replacing the hot block PB0 in D0 with a cold block [e.g., PB1] in D0). However, such logical block relinking due to late consideration of the heat distribution is inefficient. Therefore, it would be helpful to more efficiently handle logical metablock formation in such situations where a heat spread exists across blocks of different dies in order to further optimize the storage functionality of the storage device.

Accordingly, to handle logical metablock formation more efficiently, the controller may leverage the location or position of the memory dies in the storage device towards initial logical metablock linking and use. For instance, the controller may form logical metablocks from physical blocks in dies which are segregated and pooled based on their location in the storage device (e.g., their position in the SoC or their associated ball grid array (BGA)) with respect to the ASIC or its thermal influence. For example, each logical metablock may be formed from physical blocks in a group of segregated dies based on heat credit points calculated for the dies or blocks. In particular, the controller may generate or map heat credit points to physical blocks in dies based on the location of each block in the storage device with respect to the location of the controller (which affects amount of heat the ASIC impacts on NAND), and the controller may apply these heat credit points of physical blocks to arrive upon consolidated heat credit points for a die. The consolidated heat credit points for a die may be, for example, an average of the heat credit points of each block in that die. The controller may leverage this consolidated information to select (or alternatively exclude) dies or physical blocks in the creation of logical metablocks. For instance, the controller may create logical metablocks of various heat configurations (e.g., hot blocks and cold blocks) from pools of similar dies. Similar dies may be, for example, dies including same or similar consolidated heat points in a storage device having multiple meta-dies. Thus, the storage device may provide optimal die grouping based on heat levels for logical block formation without significant complexity in firmware implementation.

As a result of this grouping, the controller may efficiently bias usage of its logical metablocks (e.g., per host requirement). In one example, the controller may apply logical metablocks including cold blocks with low heat credit points for high data rate applications or namespaces associated with a high quality of service (QoS). In another example, when the controller is performing garbage collection (GC) or a host write, the controller may select a logical metablock as a destination block for the GC or host write, determine whether the logical metablock points to a logical address range associated with a high QoS application or namespace, and write data to a different pool of physical blocks accordingly depending on the determination (e.g., a pool of cold blocks if the determination is high QoS, or a pool of hot blocks if the determination is low QoS). In another example, the controller may route source data for data computations to dies with consolidated heat points less than a threshold on account of those dies being located farther from the ASIC or from some other heat emitting component than other dies. For instance, the controller may store data on which the host requests the controller to apply machine learning, filtering, or some other computation in logical metablocks associated with cold dies (depending on the threshold) rather than hot dies.

In a further biasing example, the controller may route data to logical metablocks associated with cold blocks or dies when the storage device is experiencing a high temperature or low power. Otherwise, the controller may select logical metablocks associated with hot blocks or dies for writes in normal conditions, e.g., when the storage device does not experience a high temperature or low power. Thus, the controller may normally write data to logical metablocks including hot blocks while reserving logical metablocks associated with cold blocks for backup when thermal or power conditions worsen. As a result, since the controller may utilize hot blocks significantly more than cold blocks in this example, the controller may prioritize selecting source blocks to free up during GC from the hot blocks, while saving garbage collection in the cold blocks until after a high temperature or low power condition is reached.

The controller may manage a cell voltage distribution (CVD) of each logical metablock formed from the different block pools based on the consolidated heat credit points of the memory dies. In one example, the controller may apply different CVD policies for logical metablocks associated with these dies from different pools of blocks (e.g., hot blocks and cold blocks). For instance, the controller may apply different read voltage threshold offsets or other parameters based on CVD tracking respectively for different logical metablocks, since hot blocks may for example have different CVDs (and thus different read voltage thresholds or read latency) than cold blocks. Thus, the controller may form logical metablocks using physical blocks with a same CVD (e.g., blocks having the same read voltages thresholds or read latency) for more efficient data reads.

Furthermore, the controller may manage GC of each logical metablock formed from the different block pools based on the consolidated heat credit points of the memory dies. In one example, the controller may trigger GC in response to different thresholds in each pool of physical blocks (e.g., different free block count thresholds in hot blocks and cold blocks). In another example, each pool of physical blocks may include its own set of source blocks and destination blocks for GC. Thus, the controller may relocate data from a source block originally associated with a logical metablock to a destination block subsequently associated with that logical metablock within the same pool of physical blocks. In a further example, the controller may relocate data across pools of physical blocks (e.g., from a hot block to a cold block) during GC in certain circumstances. For example, the controller may change the association of a logical metablock from a hot, source block to a cold, destination block in the same die during data relocation, in response to a change in endurance or protection requirements for the logical address of that logical metablock, in response to a re-association of that logical address to a different QoS namespace, or in response to a large number of read accesses of the hot, source block.

Additionally, the controller may statically consolidate the dies based on heat credit points during a download and execute (DLE) time of the storage device. For instance, the controller may generate or receive from a server a configuration file (or mapping table(s)) indicating a mapping of each physical block per memory die to heat credit points, and the controller may store that mapping during DLE. The mapping may also indicate a rank or heat level for each block or die; for example, larger heat credit points may be assigned to a higher rank or heat level while smaller heat credit points may be assigned to a lower rank or heat level. The controller may then form logical metablocks from these physical blocks based on this mapping, for example, in response to identifying heat credit point averages of blocks in a memory die and forming the logical metablock from dies and blocks with similar heat credit point averages or heat levels. The controller may also form the logical metablocks based on a QoS application associated with the logical addresses of those logical metablocks. For example, different QoS applications may have different heat credit point thresholds, and the controller may compare the heat credit points or heat levels associated with physical blocks to one or more of these different thresholds to determine which blocks to select or exclude in association with a logical metablock. The controller may also update the configuration file or mapping table(s) periodically during runtime of the storage device.

The controller may also dynamically modify the consolidation of memory dies during the lifetime or runtime of the storage device such that a logical metablock may be formed across different dies than in DLE. For example, in response to detecting an update to a physical block behavior (e.g., a higher error rate or lower error rate resulting from heat), a change in a number of program/erase cycles of a physical block in a memory die, or some other factor, the controller may generate and assign a different number of heat credit points to that block in the configuration file or mapping table(s). This modification in heat credit points for a block may in turn alter the consolidated heat credit points for the memory die including that block. Thus, the controller may relink the logical metablock to a different physical block in the same memory die, or to a different memory die if the modification to the consolidated heat credit points of the previous memory die is significant, in response to the dynamic configuration file update.

Thus, the controller may create and apply one type of logical metablock formed from dies having lower heat credit points (e.g., Type 1 logical blocks), and the controller may create and apply another type of logical metablock formed from dies having higher heat credit points (e.g., Type 2 logical blocks). The controller may form Type 1 logical blocks and Type 2 logical blocks from different pools of blocks (e.g., cold blocks and hot blocks), respectively. Moreover, the controller may form intermediate types of logical blocks from dies and blocks having heat credit points between those of Type 1 and Type 2 logical blocks. For instance, the controller may identify "warm-hot" blocks and dies and "warm-cold" blocks and dies having heat credit points between those of hot blocks and cold blocks, where warm-hot blocks have higher heat credit points than warm-cold blocks. The controller may apply any of the foregoing operations described with respect to hot and cold blocks (e.g., logical block formation, biasing or data routing, CVD and GC managing, consolidation during DLE and runtime, etc.) to such warm-hot and warm-cold blocks as well. For instance, any reference to hot blocks in the foregoing may be replaced by or considered together with warm-hot blocks, and any reference to cold blocks in the foregoing may be replaced by or considered together with warm-cold blocks. Similarly, the controller may apply the foregoing concepts to any number N of logical block types respectively associated with different heat levels. As a result, efficient logical block formation and application based on different temperature sensitivities or heat distribution in the storage device may be achieved.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
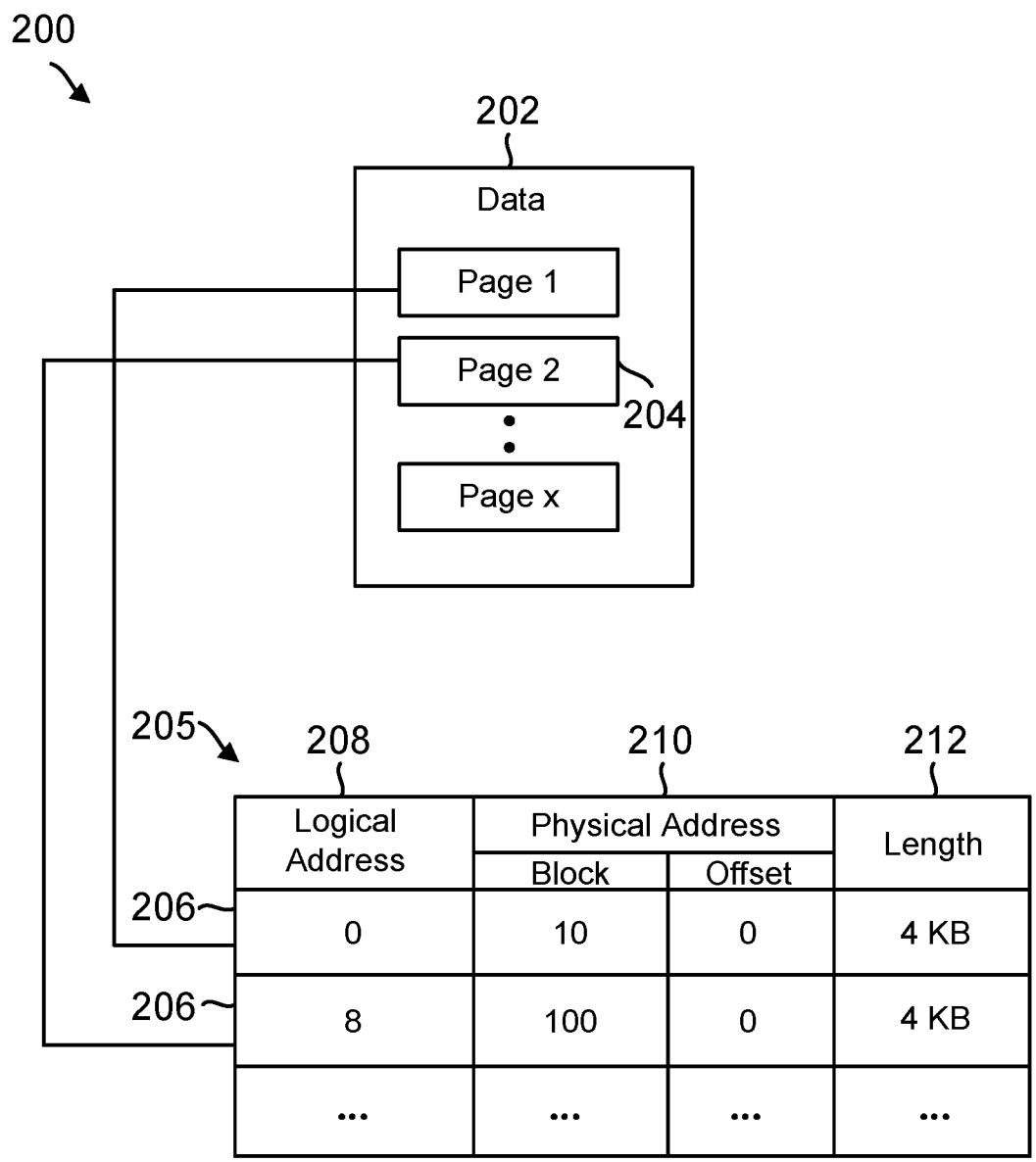
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122.

When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
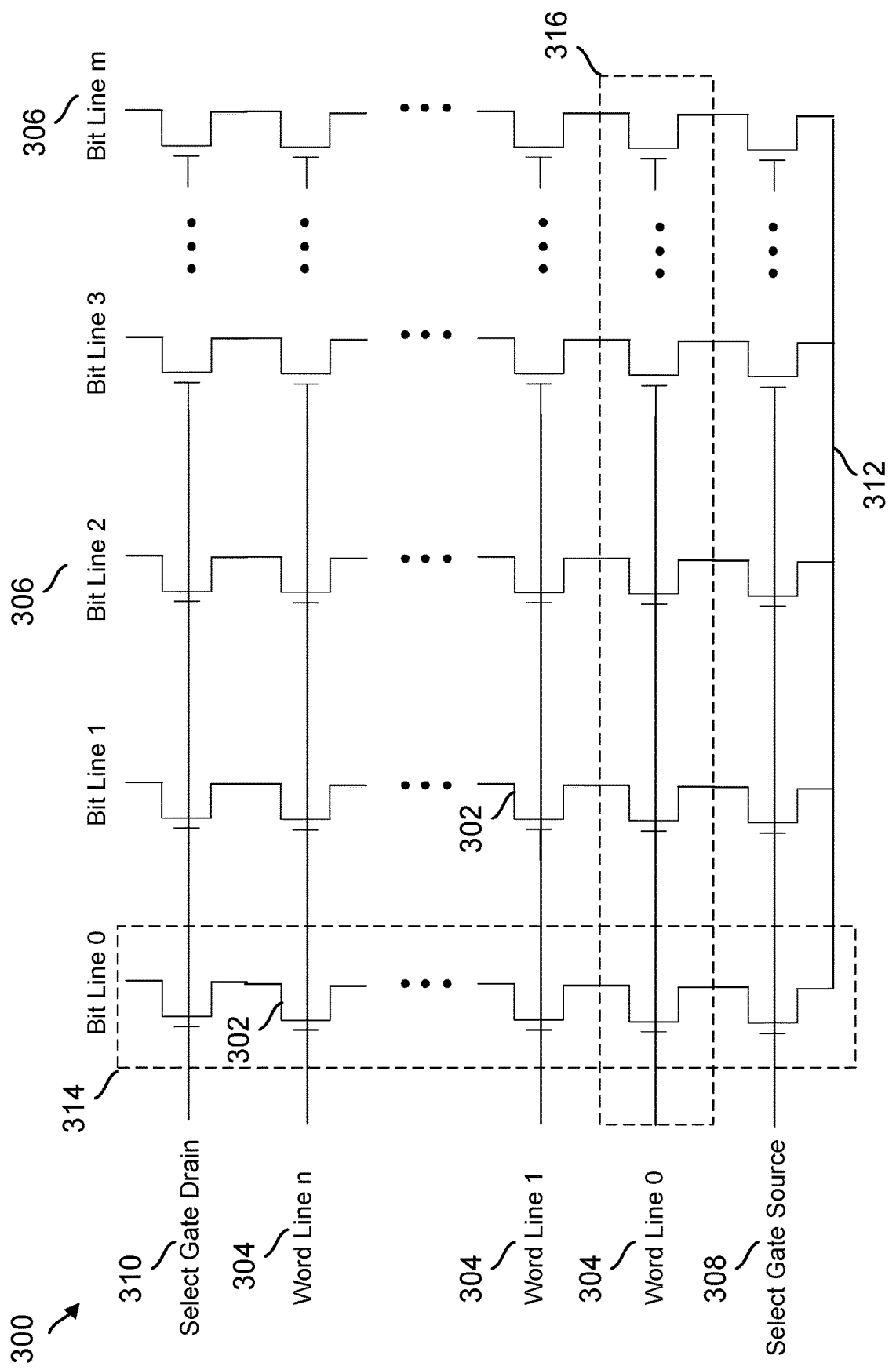
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
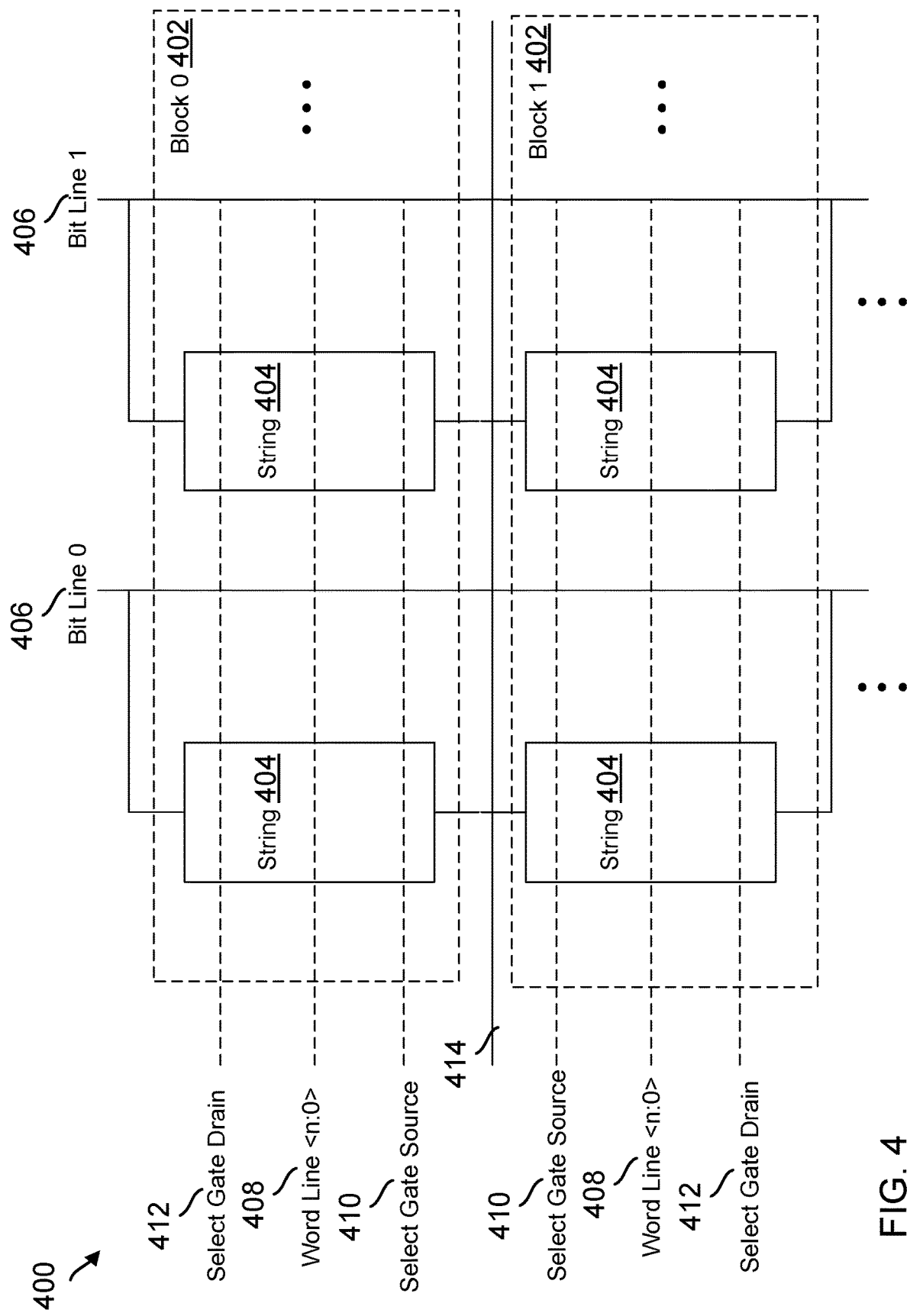
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
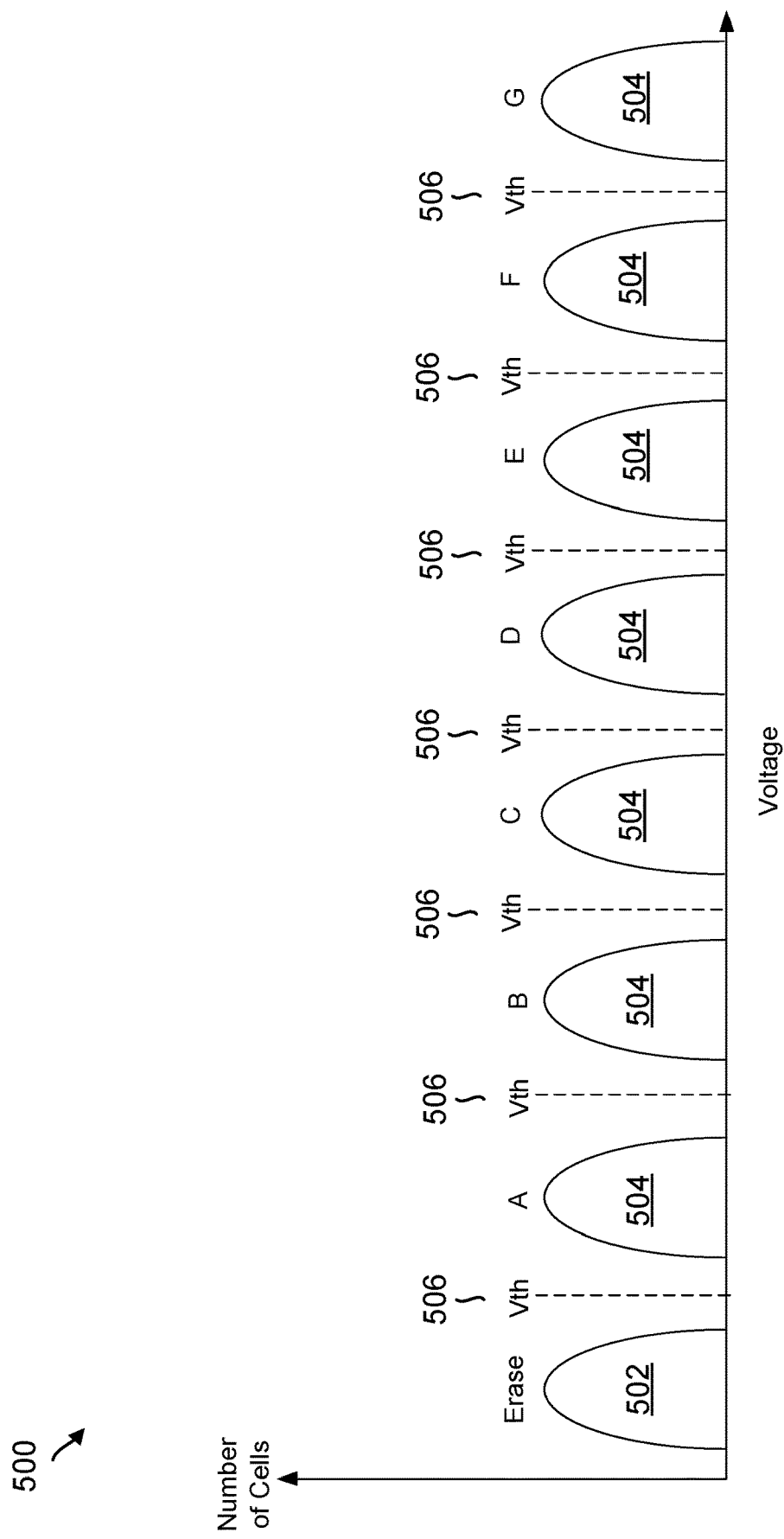
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6:
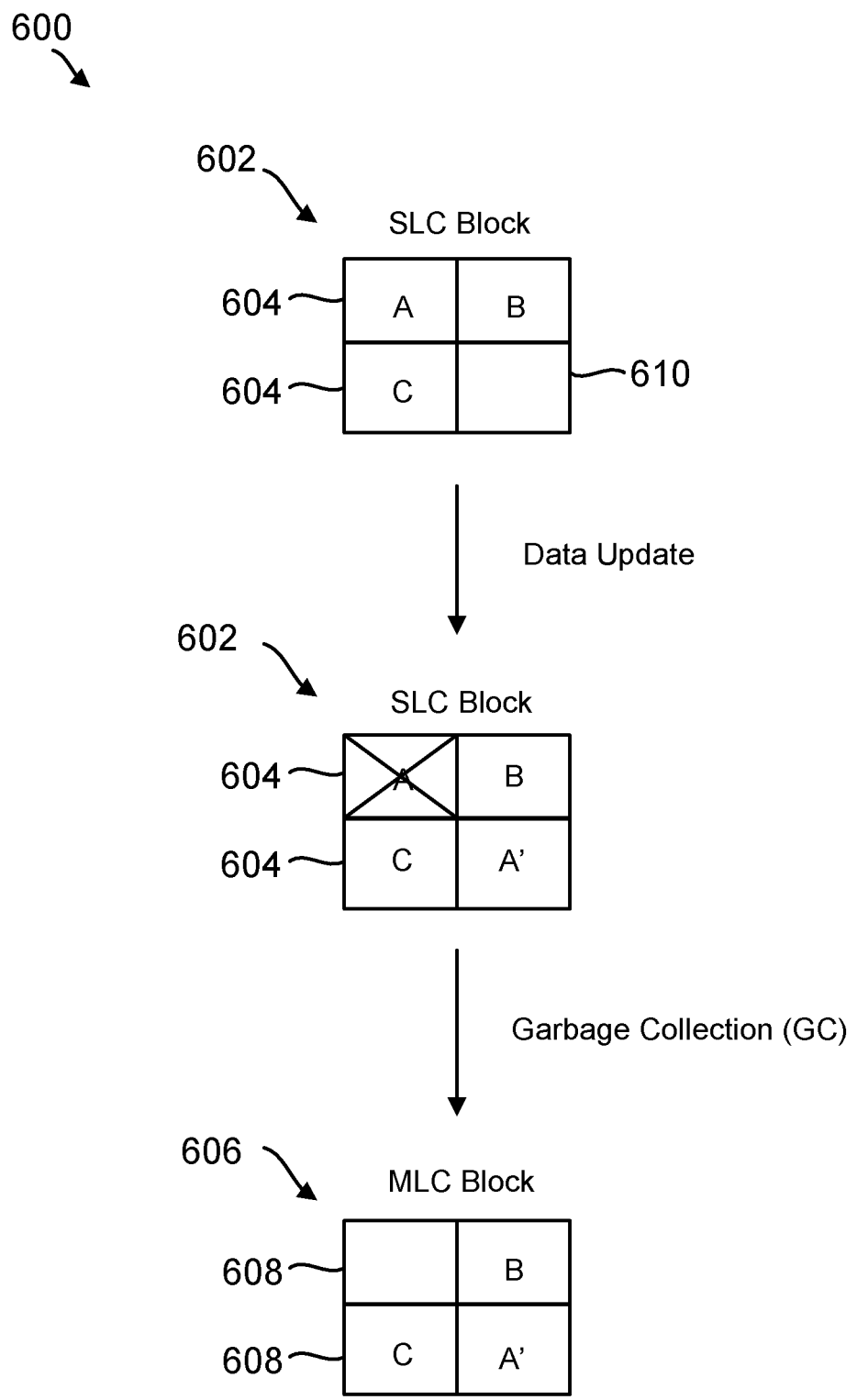
FIG. 6 is a conceptual diagram illustrating an example of a garbage collection (GC) process that may be implemented in the storage device of FIG. 1.

FIG. 6 is a conceptual diagram 600 of an example of a garbage collection process in which data stored in pages 604 of a block 602 of SLC cells are relocated to pages 608 of a block 606 of MLC cells. The data may correspond to the data 119 of FIG. 1, the blocks 602, 606 may correspond to the blocks 402 of FIG. 4, and the SLC/MLC cells may correspond to the cells 116, 302 of FIGS. 1 and 3. Each page 604, 608 includes data stored in multiple cells along a same row or word line (e.g. word line 304, 408) of the NVM. Thus, each page 604 may include data stored in a row of the cells 116 of one block, while each page 608 may include data stored in a row of the cells 116 of another block. For simplicity of illustration, the example of FIG. 6 illustrates the blocks 602, 606 each including only four pages 604, 608. However, it should be recognized that each block may include any number of pages.

In the example of FIG. 6, data represented by identifiers A, B, and C are stored in different pages 604 of the block 602. Originally, the data A, B, and C are stored in three pages of the block 602 in response to write commands from the host device, leaving one of the pages free in this example. When the storage device receives new or updated data, this data is stored in the free page 610. For example, updated data A' may be received from the host device and written to the free page 610. Since data cannot be overwritten in flash memory, the invalid data A remains stored in the block 602. As a result of new data and invalid data, the block 602 may quickly become full.

To free space in the SLC block, original and updated data in the block 602 may be transferred to the block 606. The invalid data remain in the old block. For instance, in the example of FIG. 6, the original data B and C and the updated data A' are read from the pages 604 of the block 602 and written to one or more pages 608 of the block 606. The invalid data A remains in the block 602. When the block 602 is subsequently erased, the invalid data is discarded, and the block 602 may be reused to store new data.

FIG. 7 illustrates an example of a memory die 700 including physical blocks 702 with respective heat levels 703. In the example of FIG. 7, the memory die 700 includes planes 704 of physical blocks, specifically two planes each including 48 blocks as illustrated. However, it should be understood that this example is merely intended to be illustrative in nature; in other examples the memory die may include other numbers of planes or other numbers of physical blocks. The controller may obtain a mapping 706 of heat credit points 708 for the physical blocks in each memory die. For instance, the controller may generate or receive (e.g., from a server in a configuration file) the mapping 706 of heat credit points 708 to physical blocks 702 in each memory die. In the illustrated example of FIG. 7, the mapping 706 may indicate that block 0 in plane 0 has heat credit points h1, block 1 in plane 0 has heat credit points h2, etc., where h1, h2, etc. each represent a number of heat credit points. For example, h1 may be equal to 2 heat credit points (corresponding to heat level 2), h6 may be equal to 3 heat credit points (corresponding to heat level 3), h10 may be equal to 4 heat credit points (corresponding to heat level 4), h11 may be equal to 4 heat credit points (corresponding to heat level 4), h44 may be equal to 1 heat credit point (corresponding to heat level 1), etc. The controller may ascertain which physical blocks 702 are more or less prone to heat based on the location of the physical block and die with respect to the controller in an ASIC, which location determines how much heat the ASIC impacts on the physical blocks. The different amounts of heat (and thus heat credit points) impacting each physical block are illustrated in the example heat gradient superimposed on the memory die 700 in FIG. 7, which illustrates how different physical blocks may have different heat levels 703 and associated heat credit points. For instance, in the illustrated example, the blocks indicated with heat level 4 may be closer to the location of the controller than the blocks indicated with heat level 3, which in turn may be closer to the location of the controller than the blocks indicated with heat level 2, and so forth.

To efficiently form logical metablocks from these physical blocks 702 across different memory dies 700, the controller may utilize the heat credit points 708 of the physical blocks 702 indicated in the mapping 706. For instance, the controller may obtain a consolidated amount of heat credit points respectively for each memory die by averaging the heat credit points 708 of each physical block. Since multiple physical blocks across memory dies may be differently influenced by heat, the controller leverages this consolidated information to select which memory dies to participate towards a given logical metablock. As a result, certain physical blocks may be excluded from a given logical metablock formation due to those physical blocks not matching a heat level of other physical blocks in the metablock.

As an example, if the controller intends to form a logical metablock LB10 with eight physical blocks, typically the controller forms the logical metablock from corresponding physical blocks in each one of eight, arbitrarily selected memory dies, such as physical block PB10 in memory die D0, physical block PB10 in memory die D1, and so forth up until physical block PB10 in memory die D8. However here where the storage device forms the logical metablock from physical blocks based on heat levels, the controller may select the physical blocks for a logical metablock from only those memory dies which include same or similar consolidated heat credit points (or heat levels) that meet a threshold number of heat credit points (or threshold heat level) for that logical metablock, while excluding physical blocks from other memory dies. Thus, if the storage device is a heavy memory die product (for example, a device including 128 memory dies) where numerous options of physical dies exist from which eight physical blocks may be formed into a metablock, the controller may limit these options for respective logical metablocks based on the consolidated heat credit points. Accordingly in an example, if the controller intends to form a logical metablock LB10 whose logical address is associated with a high QoS namespace or application requiring cold blocks (e.g., a threshold of 1 heat credit point), the controller may form LB10 not only from those physical blocks having 1 heat credit point, but also from physical blocks only in those memory dies which have 1 consolidated heat credit point. As a result, such logical metablock associated with high QoS may only be grouped with cold blocks in cold dies in this example, rather than for instance hot blocks in hot dies (which may impact QoS) or cold blocks in hot dies (where such cold blocks may be rare and thus may similarly impact QoS). Similarly, other logical metablocks may respectively only be grouped with hot blocks, warm-cold blocks, warm-hot blocks, etc. in hot dies, warm-cold dies, warm-hot dies, etc. based on similar heat credit point thresholds or heat level requirements.

Figure 8:
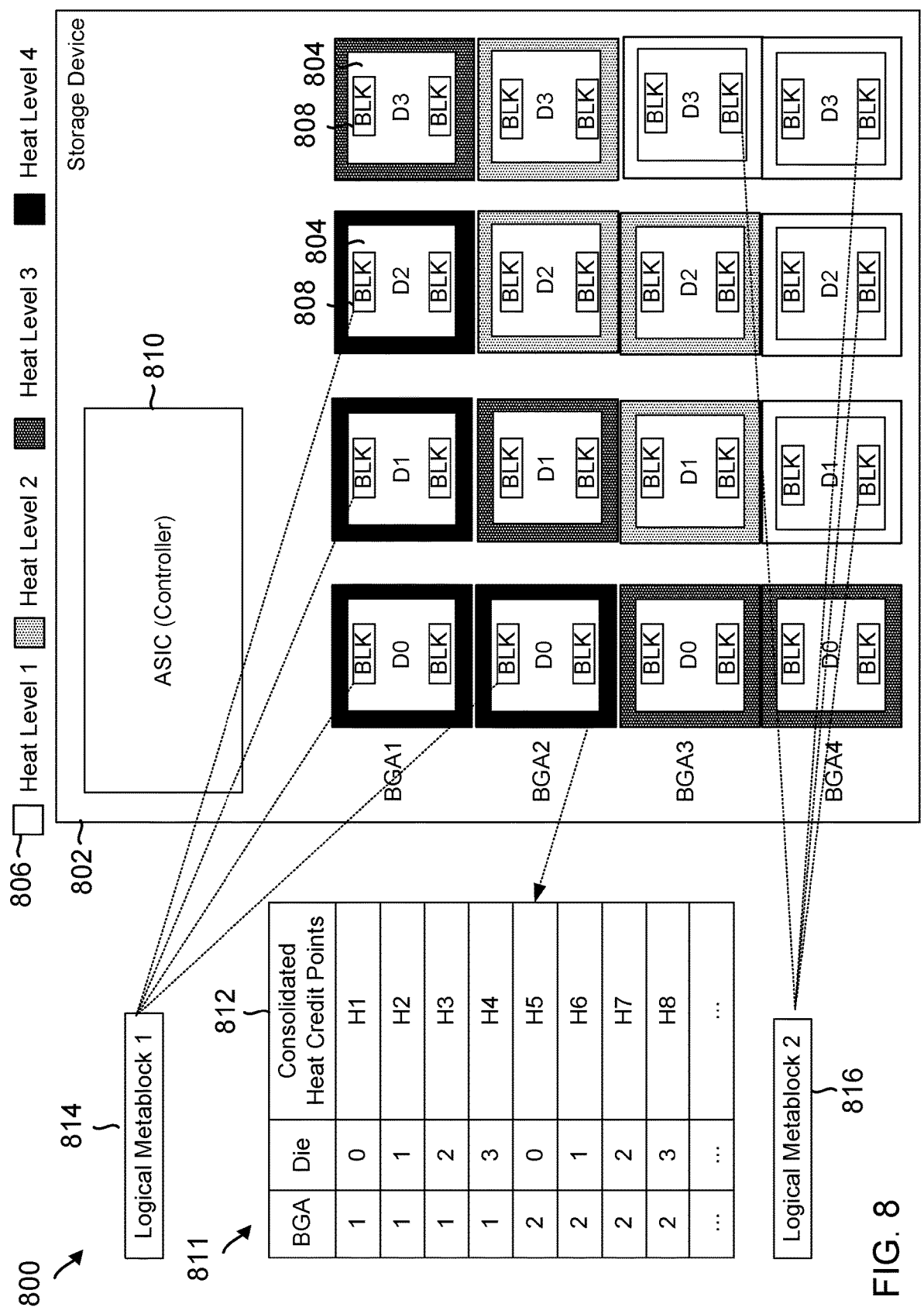
FIG. 8 is a conceptual diagram illustrating an example of the storage device of FIG. 1 including memory dies of different heat levels.

FIG. 8 illustrates an example 800 of a storage device 802 (corresponding to the storage device 102 of FIG. 1) including memory dies 804 of different heat levels 806. Each of the memory dies 804 may include multiple physical blocks 808, and the memory dies and physical blocks may be located at various positions with respect to a heat-emitting component such as an ASIC 810 including the controller of the storage device (corresponding to the controller 123 of FIG. 1). Moreover, multiple memory dies may be grouped in a BGA (e.g., as a NAND package), such as illustrated in the example of FIG. 8. In this example, the storage device 802 includes four BGAs or NAND packages each including four memory dies D0-D3, although in other examples, the number of BGAs or NAND packages and the number of memory dies in each BGA or NAND package may be different.

Initially, the controller may determine the heat credit points for each physical block 808 of each memory die 804 (e.g., based on the location or heat sensitivity of the physical block), such as the heat credit points 708 indicated in the mapping 706 of FIG. 7. The controller may then consolidate the heat credit points for each physical block of each respective memory die to arrive at a mapping 811 of consolidated heat credit points 812 to each memory die. For example, the controller may average together the heat credit points of the physical blocks in each respective memory die or perform some other function to arrive at the consolidated heat credit points 812. Thus, in the illustrated example of FIG. 8, the controller may obtain consolidated heat credit points H1 in D0 of BGA1, consolidated heat credit points H2 in D1 of BGA1, and so forth for each memory die 804, where H1, H2, etc. each represent a number of consolidated heat credit points respectively calculated from heat credit points of physical blocks for respective dies. As an example, H1 may be equal to 4 consolidated heat credit points (corresponding to heat level 4) averaging the heat credit points of physical blocks 808 in D0 of BGA1, H8 be equal to 2 consolidated heat credit points (corresponding to heat level 2) averaging the heat credit points of physical blocks 808 in D3 of BGA2, and so forth. As a result of this consolidation, the controller may determine the heat distribution of the storage device 802. For instance, in the illustrated example of FIG. 8, the controller may determine from mapping 811 that dies D0, D1, D2 of BGA1 and D0 of BGA2 have a heat level 4 and thus are hot dies, dies D3 of BGA1, D1 of BGA2, D0 of BGA 3, and D0 of BGA4 have a heat level 3 and thus are warm-hot dies, dies D2 and D3 of BGA 2 and D1 and D2 of BGA3 have a heat level 2 and thus are warm-cold dies, and dies D3 of BGA3 and D1, D2, and D3 of BGA4 have a heat level 1 and thus are cold dies. It should be understood that this heat distribution of the memory dies is just an example; in other examples, the memory dies may have different heat levels based on a different location of the ASIC 810 or other heat-emitting component.

In response to the consolidated heat credit points 812, the controller may ascertain which physical blocks 808 of which memory dies 804 to include in a given logical metablock, or similarly, which memory dies 804 to include or skip when allocating physical blocks to a logical metablock. For example, if the storage device 802 includes sixteen dies as illustrated and the controller intends to form a first logical metablock 814 from only hot blocks (corresponding to heat level 4) and a second logical metablock 816 from only cold blocks (corresponding to heat level 1), the controller may compare the consolidated heat credit points 812 of each of the sixteen dies against the thresholds for the first logical metablock (in this example, 4 consolidated heat credit points) and the second logical metablock (in this example, 1 consolidated heat credit point), and the controller may associate one of the physical blocks 808 in each of those memory dies which meet the corresponding threshold to the respective logical metablock. Thus, in the example of FIG. 8, the controller may associate physical blocks in D0, D1, and D2 of BGA1 and D0 of BGA2 with first logical metablock 814 since those dies all meet the threshold of 4 consolidated heat credit points for the first logical metablock, and the controller may associate physical blocks in D3 of BGA3 and D1, D2, and D3 of BGA4 with second logical metablock 816 since those dies all meet the threshold of 1 consolidated heat credit point for the second logical metablock.

Accordingly, the controller may check multiple physical blocks for associating with a logical metablock, determine whether those physical blocks meet the required heat level of the logical metablock, and exclude those physical blocks from memory dies which do not meet that heat level. As a result, the controller may create different logical metablocks of various heat configurations from different pools of blocks grouped by their respective numbers of consolidated heat credit points. For instance, in the example of FIG. 8, first logical metablock 814 may be associated with physical blocks from only hot dies (corresponding to heat level 4) and second logical metablock 816 may be associated with physical blocks from only cold dies (corresponding to heat level 1). Similarly, other logical metablocks may be associated with physical blocks from only warm-hot dies (corresponding to heat level 3) or only warm-cold dies (corresponding to heat level 2). While these logical metablocks may generally be associated with physical blocks having the same heat level as the memory dies in which they are contained (e.g., hot blocks from hot dies and cold blocks from cold dies), the logical metablocks are not limited in this manner. As an example, logical metablocks associated with a high QoS application which require physical block heat levels of 2 or below, may include physical blocks having heat level 1 or heat level 2 even from memory dies of only heat level 1. Thus, logical metablocks may include cold blocks or warm-cold blocks from cold dies, hot blocks or warm-hot blocks from hot dies, cold blocks or warm-cold blocks from warm-cold dies, and the like.

The controller may determine the heat credit points 708 or heat levels 703 for each physical block 702, as well as the consolidated heat credit points 812 or heat levels 806 for each memory die 804, following fabrication or design of the storage device 102, 802. For instance, during a fabrication/design phase, a static analysis may be run to determine the physical blocks in a given NAND package which may be impacted in different manners by different amounts of heat. As an example, a heat-emitting component such as the ASIC 810 including the controller 123 may have a radar subsystem which indicates the areas that correspond to physical blocks that get heated more than others. A static mapping table in the device (e.g., mapping 706 or mapping 811) may be formed as a result which provides the controller the information it applies for the association of logical metablocks based on heat impact. The controller may generate or obtain (e.g., from a server) the number of heat credit points or heat level for a given physical block arbitrarily based on a proximity of that physical block to the ASIC or other heat-emitting component. For instance, a server may run a simulation model which provides the heat credit point values, and these values may be provided to the controller in a configuration file during DLE. This file may indicate the mapping 706 of each physical block to different heat credit points based on the results of the simulation model. The controller may then utilize this mapping to derive the mapping 811 of memory dies to heat levels, and the controller may apply the mappings when forming logical metablocks. For example, the mappings 706, 811 may indicate that one physical block in one memory die has one rank or heat level, another physical block in another memory die has another rank or heat level, and so forth. The controller may periodically obtain updates to the configuration file maintaining or modifying the indicated heat level mapping for each physical block.

Before runtime or during manufacture, the controller may generate the mappings 706, 811 during its simulations which indicate the number of heat credit points assigned to each physical block and each memory die. When the controller attempts to link physical blocks to a logical metablock during a DLE time (or in some cases during runtime), the controller may first look at the mappings 706, 811 for physical blocks associated with a certain heat level or number of heat credit points depending on the QoS application of that logical metablock. For instance, the controller may search the mappings 706, 811 to identify physical blocks associated with heat levels or heat credit point values of 1 or 2 (corresponding to cold blocks or warm-cold blocks) for high QoS applications. The controller may then map those physical blocks to the logical metablock in memory dies which meet this high QoS threshold, and the controller may skip memory dies which do not meet this threshold. Typically, the controller stores the mappings 706, 811 as static information in a firmware configuration during a DLE time of the storage device, which occurs during storage device fabrication or design. During DLE, the controller of the storage device may download and execute the firmware (e.g., from a server) to make the device ready for use. The mappings 706, 811 which are generated or derived from the simulation models may be stored initially in the firmware configuration and applied during DLE, which time is when logical metablocks are generally initially linked. Thus, the logical metablocks may be linked according to these mappings 706, 811 before the storage device is shipped for consumer use.

Afterwards during runtime, the controller may also relink or update logical metablocks. For instance, during the device lifetime, the controller may upgrade or dynamically create new logical metablocks based on physical block behavior updates. As an example, some physical blocks may transition from cold blocks to hot blocks due to an increase in emitted heat from the ASIC 810, resulting in these transitioned physical blocks having updated heat credit points. Thus, the controller may update the mappings 706, 811 accordingly as well as the logical metablocks which originally included these transitioned physical blocks to now exclude those physical blocks from the relinked metablock. To detect the cold-to-hot transition, the controller may, for instance, monitor the number of program/erase (P/E) cycles of these physical blocks, and when the number of P/E cycles exceeds a certain threshold, the controller may increase the number of heat credit points for that associated block in the mappings by at least one heat level. As such dynamic changes may affect the physical blocks capable of being linked in a logical metablock, the controller may be triggered to relink a logical metablock to exclude such physical blocks in response to these changes. For example, in response to a number of P/E cycles of a physical block exceeding the threshold and thus transitioning from a cold block to a hot block, the controller may relink the logical metablock to replace that hot block with a new cold block in the same memory die (or in a different memory die if the consolidated heat credit points for the previous die changes as a result).

The controller may apply a biased cell voltage distribution (CVD) policy for different logical metablocks. An example of a CVD is illustrated in FIG. 5. Generally, a CVD policy, such as tracking read voltage thresholds in physical blocks to determine sufficient read voltages for sensing data from the blocks, is applied uniformly across physical blocks in a storage device. However here, where the controller has identified different pools of physical blocks for logical metablocks based on their heat credit points or heat levels (e.g., pools of hot blocks, pools of cold blocks, etc.), the CVD policy may no longer be uniform across the different pools. As an example, the controller may not perform CVD tracking in one pool but the controller may perform CVD tracking in another pool. For instance, due to the higher temperature sensitivity of hot blocks, the controller may track the CVD of these blocks to ensure that a given word line in each hot block assigned to a logical metablock may be read using the same read voltage, while due to the lower temperature sensitivity of cold blocks, the controller may not track the CVD of these blocks since ensuring the read voltages are the same across cold blocks may not be as important as for hot blocks.

Alternatively, rather than not tracking the CVD of these cold blocks at all, the controller may track the CVD of cold blocks to identify different read voltage parameters to apply than those applied for hot blocks. For instance, when tracking CVDs of cold blocks and hot blocks, the controller may determine different sense values corresponding to read voltages, different error counts, different bit error rate counts, and the like due to the difference in CVDs resulting from heat differences across the respective block pools. As a result, the controller may apply different parameters (e.g., read voltage threshold offsets) for cold blocks and hot blocks accordingly. The controller may run its CVD policy in different threads for each pool of physical blocks (e.g., cold blocks, hot blocks, etc.) to identify read voltage sense values, latency, and other information that are common for each respective pool of physical blocks. The controller may also apply respective CVD policies for different pools of physical blocks at different rates or frequencies (e.g., the controller may determine read voltage threshold offsets at a faster rate for hot blocks than for cold blocks, for example). The controller may also relink its logical metablocks or perform data relocation in response to the CVD policies, so that the controller may ensure the linked physical blocks have the same CVDs and thus that the different CVD policies may respectively apply to logical metablocks linked only to physical blocks of a same heat level.

Similarly, the controller may apply different garbage collection (GC) for different logical metablocks. Typically in GC, such as described above with respect to FIG. 6, valid data is moved from one or more source blocks to a destination block before the source block(s) are released or erased. This relocation may be triggered in response to meeting of one or more thresholds, such as a free block count meeting a certain value. However here, since physical blocks are segregated into different pools (e.g., hot blocks, cold blocks, etc.), the controller may apply GC differently in respective pools. For instance, the hot blocks may have one free block count threshold for GC while the cold blocks may have a different free block count threshold for GC. The controller may also run separate GC contexts in each pool of blocks. For example, the controller may apply one GC context for hot blocks in which data is relocated from one or more hot source blocks to a hot destination block, and another GC context for cold blocks in which data is relocated from one or more cold source blocks to a cold destination block (e.g., the hot block pool includes its own source and destination blocks, the cold block pool includes its own source and destination blocks, etc.). The controller may thus relink its logical metablocks so that when GC is performed, the association of a source block from one pool to the logical metablock is replaced with an association of a destination block from the same pool to that logical metablock (e.g., hot source blocks are replaced with hot destination blocks, cold source blocks are replaced with cold destination blocks, etc.).

Similar to segregating physical blocks into different pools, the controller may segregate memory dies into different pools. For instance, in the example of FIG. 8, the controller may separate the memory dies 804 into different pools based on the consolidated heat credit points 812 of each memory die, so that the controller may allocate logical metablocks from physical blocks within a same pool of memory dies. The controller may determine the different pools of memory dies for logical block formation based on the heat credit points of the physical blocks. For instance, for each memory die, the controller may consolidate (e.g., average) the heat credit points of each physical block in that memory die from the mapping 706 of heat credit points 708 to physical blocks 702 in FIG. 7 to obtain the consolidated heat credit points 812 for that memory die, and after forming the mapping 811 of consolidated heat credit points 812 to each memory die, the controller may categorize each die with different heat levels 806 based on comparison of the consolidated heat credit points to different thresholds (e.g., heat level 1 if the consolidated heat credit points meet one threshold, heat level 2 if the consolidated heat credit points meet another threshold, etc.). This consolidation may be performed during fabrication or design of the storage device, during DLE, or dynamically during runtime of the storage device. The controller may then logically link logical blocks to physical blocks of segregated dies accordingly. For example, logical metablock 1 814 may be linked to physical blocks 808 in one pool of memory dies (e.g., the dies corresponding to heat level 4), and logical metablock 2 816 may be linked to physical blocks 808 in another pool of memory dies (e.g., the dies corresponding to heat level 1). Similarly, other logical metablocks may be linked to physical blocks in warm-hot pools or warm-cold pools of memory dies. Moreover, the controller may apply different CVD policies and GC contexts for respective pools of memory dies such as previously described.

Thus, the controller may form at least N types of logical metablocks, where N is the number of segregated pools of memory dies (or pools of physical blocks). For instance, in the example of FIG. 8, the controller may segregate memory dies into pools of hot dies, warm-hot dies, warm-cold dies, and cold dies (i.e., N=4), and so the controller may form 4 types of logical metablocks respectively from physical blocks in each pool. In other examples, the controller may segregate memory dies at the very least into pools of hot dies (or warm-hot dies) and cold dies (or warm-cold dies) (i.e., N=2). A logical metablock associated with cold/warm-cold dies or cold/warm-cold blocks may be referred to as a Type 1 logical metablock, while a logical metablock associated with hot/warm-hot dies or hot/warm-hot blocks may be referred to as a Type 2 logical metablock. Thus in the example of FIG. 8, logical metablock 1 814 may be a Type 2 logical metablock, while logical metablock 2 816 may be a Type 1 logical metablock.

The controller may store data in Type 1 logical metablocks during special situations (e.g., a low power mode or a high temperature mode of the storage device 802), since the physical blocks of Type 1 logical metablocks may be less affected by thermal energy than those of Type 2 logical metablocks. Thus, the controller may normally write data to Type 2 logical metablocks (e.g., when it is not in a low power mode or high temperature mode), while reserving Type 1 logical metablocks as spares. The controller may fallback to Type 1 logical metablocks in the special situations (e.g., during temperature throttling). The controller may also free a number of Type 1 logical metablocks (e.g., in GC) during initialization of the storage device or otherwise before data writes or relocation to ensure that a sufficient number of fallback blocks exist in the event of a low power mode or high temperature mode. The controller may apply different GC logic, CVD logic, or other logic for Type 1 logical metablocks and Type 2 logical metablocks. Although such policies may cause Type 2 logical metablocks to be used more often than Type 1 logical metablock blocks (leading to P/E differences between pools of physical blocks), this imbalance in block utilization may be resolved by wear leveling.

With respect to GC, generally the controller configures source blocks and destination blocks for data relocation within a same pool of memory dies or physical blocks, such that data from cold blocks are relocated to other cold blocks (e.g., in a Type 1 logical metablock) and data from hot blocks are relocated to other hot blocks (e.g., in a Type 2 logical metablock). However, in some cases, the logical address associated with a logical metablock may undergo a change in an endurance requirement, a protection requirement, or other host requirement. In such case, during GC, data may be relocated from one type of logical metablock to another type of logical metablock (referred to here as cross-pool GC). As an example, the controller may originally form a Type 2 logical metablock from hot blocks due to its logical address being associated with a low QoS application or namespace (e.g., a low endurance or protection requirement), but the controller may later determine during GC that the logical address is now associated with a high QoS application or namespace (e.g., a high endurance or protection requirement). As a result, the controller may change the Type 2 logical metablock to a Type 1 logical metablock during GC such that the data will now be stored in cold blocks to provide high QoS for the host device. For instance, the controller may relocate data from hot blocks to cold blocks (e.g., across the segregated pools) and change the association of the source logical address accordingly to a Type 1 logical metablock, or the controller may relocate data from a Type 2 logical metablock to a Type 1 logical metablock with a different logical address.

In one example, the controller may trigger cross-type GC when, following a host write of the data to a Type 2 logical metablock due to its LBA range originally being associated with low QoS, the controller determines that the Type 2 logical metablock becomes full and that the source LBA range is now associated with a high QoS namespace. In such case, the controller may select a destination LBA range also associated with a high QoS namespace (including Type 1 logical metablocks) in which to relocate the currently high QoS data. In another example, the controller may trigger cross-type GC for physical blocks associated with large amounts of read accesses. For instance, if the controller receives a host read command to read data from a Type 2 logical metablock, and the controller determines that this particular data or group of physical blocks is often requested to be read, the controller may relocate the data subsequently during GC to a Type 1 logical metablock for improved QoS since the data is being accessed frequently.

Figure 9:
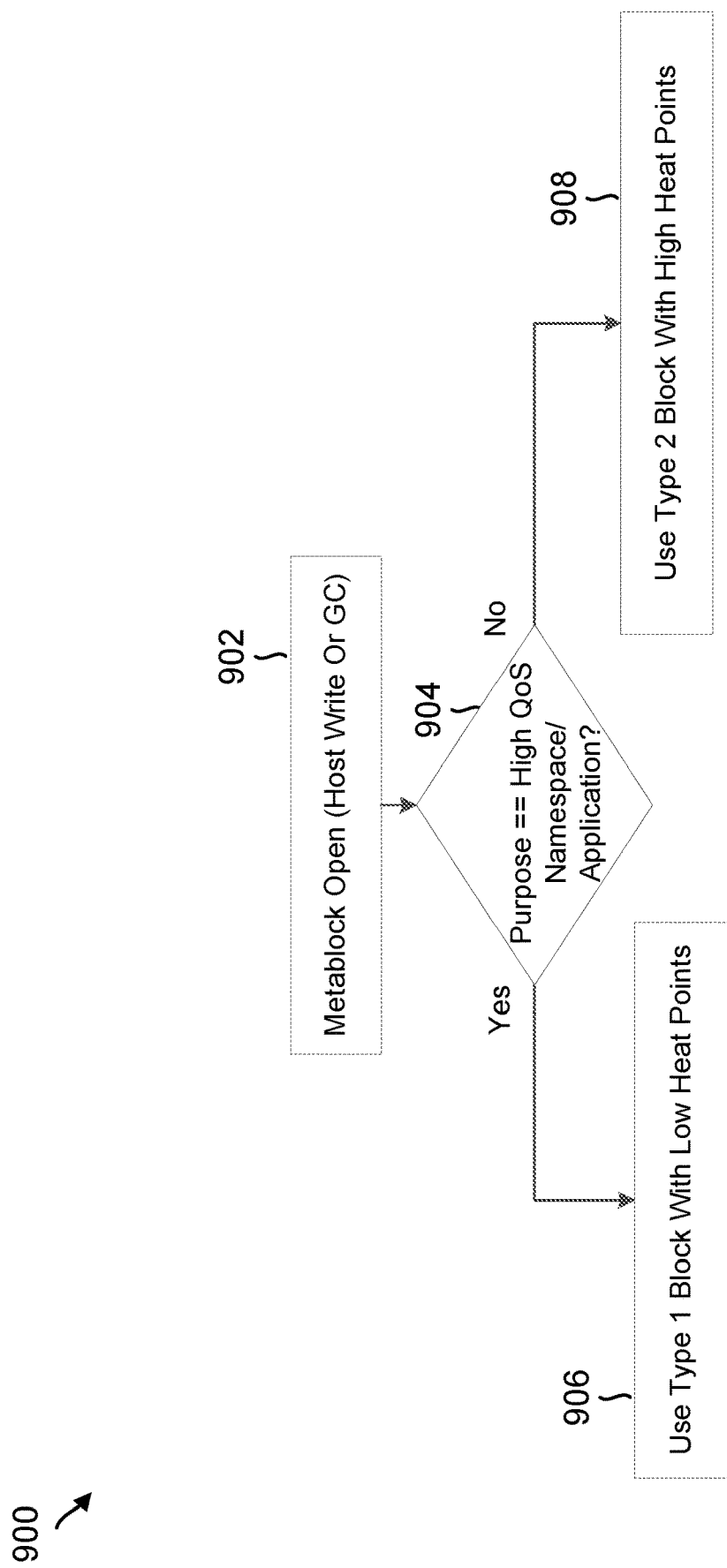
FIG. 9 is a flow chart illustrating an example of a method for writing data to logical metablocks associated with different heat levels, as performed by the storage device of FIG. 1.

FIG. 9 illustrates an example flow chart 900 of a method for writing data to logical metablocks associated with different heat levels. For example, the method can be carried out in a storage device 102 such as the one illustrated in FIG. 1. Each of the steps in the flow chart can be controlled using the controller as described below (e.g. controller 123), by a component or module of the controller, or by some other suitable means.

As represented by block 902, the controller may initially select an open logical metablock as a destination in which to perform a host write or a data relocation during GC. For either host writes or GC relocation writes, at block 904, the controller may check the purpose of the write, e.g., if the destination block points to a LBA range associated with a high QoS application or namespace which would require Type 1 logical metablocks. If so, at block 906, the controller may apply a Type 1 logical metablock for the host write or GC. If not, then at block 908, the controller may apply a Type 2 logical metablock for the host write or GC.

Figure 10:
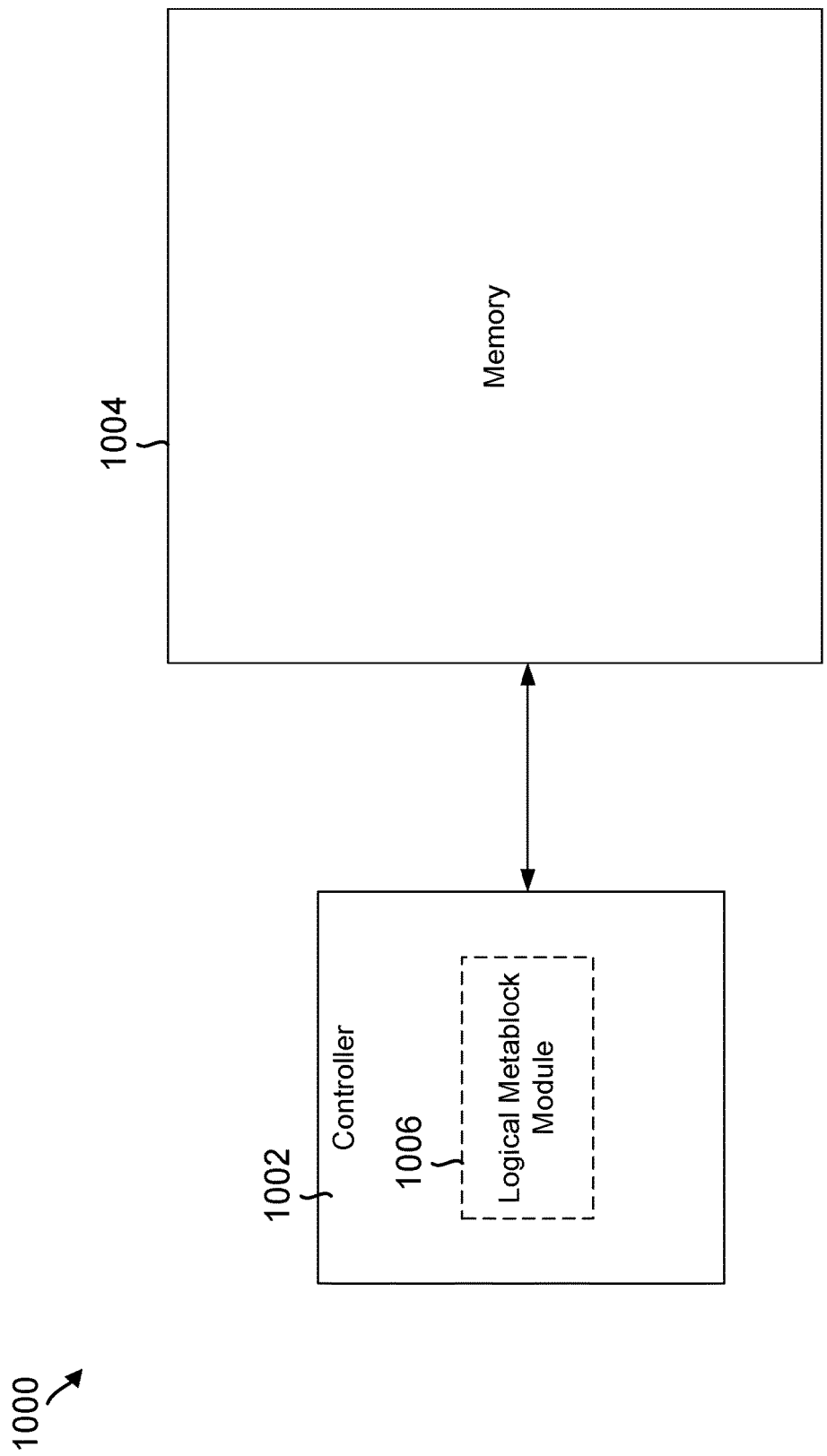
FIG. 10 is a conceptual diagram illustrating an example of a controller that handles logical metablocks based on a heat distribution of the storage device of FIG. 1.

FIG. 10 is a conceptual diagram illustrating an example 1000 of a controller 1002 coupled to a memory 1004 in a storage device. For example, controller 1002 may correspond to controller 123 and memory 1004 may correspond to the NVM 110 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1002 includes a logical metablock module 1006 that may provide a means for handling logical metablocks based on a heat distribution of the storage device. In one example, the storage device includes a plurality of memory dies each including a physical block, and the controller (e.g., the logical metablock module 1006) may be configured to form a logical metablock from the physical blocks based on a location of each of the memory dies with respect to the controller. For instance, referring to the Figures, the controller 123 may form logical metablock 1 814 from the physical blocks 808 in one group of the memory dies 804 which are located closer to the ASIC 810 including controller 123 (e.g., resulting in those dies having a heat level 4), while the controller 123 may form logical metablock 2 816 from the physical blocks 808 in another group of the memory dies 808 which are located farther from the ASIC 810 including controller 123 (e.g., resulting in those dies having a heat level 1).

In one example, the controller (e.g., the logical metablock module 1006) may be further configured to obtain heat credit points associated with each of the physical blocks, and to form the logical metablock based on the heat credit points. For instance, referring to the Figures, the controller 123 may obtain heat credit points 708 associated with each of the physical blocks 702, 808, and the controller may form logical metablock 1 814 from the physical blocks 702, 808 which are associated with heat credit points corresponding to a same heat level (e.g., physical blocks having 4 heat credit points or corresponding to heat level 4).

In one example, one of the memory dies includes a plurality of physical blocks, and the controller (e.g., the logical metablock module 1006) may be further configured to obtain heat credit points associated with each of the physical blocks of the one of the memory dies, to consolidate the heat credit points, and to form the logical metablock based on the consolidation. The controller (e.g., the logical metablock module 1006) may be further configured to select multiple ones of the memory dies for forming the logical metablock based on the consolidation. For instance, referring to the Figures, the controller 123 may obtain heat credit points 708 associated with each of the physical blocks 702, 808 of one of the memory dies 700, 804, and consolidate (e.g., average) the heat credit points 708 to obtain consolidated heat credit points 812 for that memory die. The controller may similarly obtain heat credit points of other physical blocks in respective memory dies and consolidate these heat credit points for the other memory dies. The controller may then form logical metablock 1 814 from the physical blocks 702, 808 in the memory dies 700, 804 which are associated with consolidated heat credit points 812 corresponding to a same heat level (e.g., memory dies having 4 consolidated heat credit points or corresponding to heat level 4).

In one example, the controller (e.g., the logical metablock module 1006) may be further configured to form the logical metablock based on first heat credit points associated with one of the memory dies, and to form a second logical metablock based on second heat credit points associated with each of a plurality of other memory dies, wherein the first heat credit points and the second heat credit points indicate different heat levels. The logical metablock and the second logical metablock may each be associated with a different quality of service (QoS). The controller (e.g., the logical metablock module 1006) may be further configured to store source data for data computations in the logical metablock in response to the first heat credit points indicating a lower heat level than the second heat credit points. For instance, referring to the Figures, the controller 123 may form logical metablock 1 814 from memory dies 804 having one value of consolidated heat credit points 812 (e.g., memory dies having 4 consolidated heat credit points corresponding to heat level 4), while the controller may form logical metablock 2 816 from memory dies 804 having a different value of consolidated heat credit points 812 (e.g., memory dies having 1 consolidated heat credit point corresponding to heat level 1). In such case, logical metablock 1 814 may be associated with a lower QoS than logical metablock 2 816, since the former logical metablock includes hot physical blocks while the latter logical metablock includes cold physical blocks. The controller may thus store source data for data computations (e.g., machine learning, filtering, etc.) in logical metablock 2 816 as a result of that metablock having a lower heat level than logical metablock 1 814.

In one example, the controller (e.g., the logical metablock module 1006) may be further configured to form a first logical metablock from multiple ones of the physical blocks based on a first heat level associated with one of the memory dies, and to form a second logical metablock from other multiple ones of the physical blocks based on a second heat level associated with another one of the memory dies, wherein the first heat level is different than the second heat level. For instance, referring to the Figures, the controller 123 may form logical metablock 1 814 from physical blocks 808 in the memory dies 804 having heat level 4, while the controller may form logical metablock 2 816 from physical blocks 808 in the memory dies 804 having heat level 1.

In one example, the controller (e.g., the logical metablock module 1006) may be further configured to apply different CVD parameters for the first logical metablock and the second logical metablock in response to the first heat level being different than the second heat level. For instance, referring to the Figures, due to the higher heat level of the hot blocks in logical metablock 1 814 than the cold blocks in logical metablock 2 816, the controller 123 may track the CVD of the hot blocks to ensure that a given word line in each hot block assigned to a logical metablock may be read using the same read voltage, while the controller may not track the CVD of the cold blocks since ensuring the read voltages are the same across cold blocks may not be as important as for hot blocks. Alternatively, the controller may track the CVD of the cold blocks to identify different read voltage parameters to apply than those applied for hot blocks. For instance, when tracking CVDs of cold blocks and hot blocks, the controller may determine different sense values corresponding to read voltages, different error counts, different bit error rate counts, and the like due to the difference in CVDs resulting from heat differences across the respective block pools. As a result, the controller may apply different parameters (e.g., read voltage threshold offsets) for the cold blocks in logical metablock 2 816 and the hot blocks in logical metablock 1 814 accordingly.

In one example, the controller (e.g., the logical metablock module 1006) may be further configured to relocate first data in the first logical metablock from a first source block to a first destination block during a first garbage collection, and to relocate second data in the second logical metablock from a second source block to a second destination block during a second garbage collection, wherein the first source block and the first destination block are associated with the first heat level, and the second source block and the second destination block are associated with the second heat level. For instance, referring to the Figures, the controller 123 may relocate data 119 in logical metablock 1 814 from a hot block of the physical blocks 808 (e.g., block 602) to another hot block of the physical blocks 808 (e.g., block 606) in a same one of the memory dies 804 during GC, while the controller 123 may relocate data 119 in logical metablock 2 816 from a cold block of the physical blocks 808 (e.g., block 602) to another cold block of the physical blocks 808 (e.g., block 606) in a same one of the memory dies 804 during GC.

In one example, the controller (e.g., the logical metablock module 1006) may be further configured to relocate data in the first logical metablock from a source block to a destination block during garbage collection, and the source block and the destination block are associated with different heat levels. For instance, referring to the Figures, the controller 123 may relocate data 119 from logical metablock 1 814 to logical metablock 2 816. For example, during cross-pool GC, the controller may relocate the data from hot blocks of the physical blocks 808 (e.g., block 602) in one group of the memory dies 804 (corresponding to heat level 4) to cold blocks of the physical blocks 808 (e.g., block 606) in another group of the memory dies 804 (corresponding to heat level 1).

In one example, one of the memory dies includes multiple physical blocks, and the controller (e.g., the logical metablock module 1006) may be further configured to consolidate heat credit points associated with each of the multiple physical blocks during a DLE time of the storage device, and to form the logical metablock based on the consolidation.

The controller (e.g., the logical metablock module 1006) may be further configured to obtain a mapping of the heat credit points to each of the multiple physical blocks during the DLE time. For instance, referring to the Figures, during DLE, the controller 123 may obtain the mapping 706 of heat credit points 708 to physical blocks 702, 808 (e.g., from a configuration file from a server), and the controller may derive the mapping 811 of consolidated heat credit points 812 to memory dies 804 from the mapping 706 (e.g., by averaging the block heat credit points in a given memory die to arrive at consolidated heat credit points for that die).

In one example, the controller (e.g., the logical metablock module 1006) may be further configured to store a mapping of heat credit points to each of the physical blocks, and to form a logical metablock from multiple ones of the physical blocks based on the mapping. For instance, referring to the Figures, the controller may store mapping 706 of heat credit points 708 to physical blocks 702 in the NVM 110 or the volatile memory 118. The controller may then apply this mapping to form logical metablock 1 814 and logical metablock 2 816. For instance, after the controller obtains the consolidated heat credit points 812 of each of the memory dies 804 from the mapping 706, the controller may respectively associate logical metablock 1 814 and logical metablock 2 816 with the physical blocks 808 in respective groups of the memory dies 804 each having a same number of consolidated heat credit points. As an example such as illustrated in FIG. 8, logical metablock 1 may be formed from blocks in a group of dies having 4 consolidated heat credit points corresponding to heat level 4, while logical metablock 2 may be formed from blocks in a group of dies having 1 consolidated heat credit point corresponding to heat level 1.

In one example, the controller (e.g., the logical metablock module 1006) may be further configured to modify the mapping during a runtime of the storage device. For instance, referring to the Figures, the controller may update mappings 706, 811 during the device lifetime to account for physical block behavior updates. As an example, the controller may increase the heat credit points 708 of certain ones of the physical blocks 808 in response to increases in P/E cycles to those physical blocks that may transition those blocks from cold to hot. To detect the cold-to-hot transition, the controller may, for instance, monitor the number of P/E cycles of these physical blocks, and when the number of P/E cycles exceeds a certain threshold, the controller may increase the number of heat credit points for that associated block in the mappings by at least one heat level. The controller may then relink the logical metablock including that hot block with a new cold block in the same memory die (or in a different memory die if the consolidated heat credit points for the previous die changes as a result).

In one example, the controller (e.g., the logical metablock module 1006) may be further configured to form the logical metablock from the physical blocks based on first heat points associated with one of the memory dies, and to form a second logical metablock from the physical blocks based on second heat points associated with another one of the memory dies, wherein the first heat points is lesser than the second heat points. For instance, referring to the Figures, the controller 123 may form logical metablock 1 814 from memory dies 804 having one value of consolidated heat credit points 812 (e.g., memory dies having 4 consolidated heat credit points corresponding to heat level 4), while the controller may form logical metablock 2 816 from memory dies 804 having a lesser value of consolidated heat credit points 812 (e.g., memory dies having 1 consolidated heat credit point corresponding to heat level 1).

In one example, the controller (e.g., the logical metablock module 1006) may be further configured to store data in one of the physical blocks associated with lesser heat points in response to a greater temperature of the storage device, and to store the data in a different one of the physical blocks associated with greater heat points in response to a lesser temperature of the storage device. For instance, referring to the Figures, the controller 123 may normally store data in logical metablock 1 814 (rather than logical metablock 2 816) at lower temperatures of the storage device 102, 802, since logical metablock 1 is associated with blocks in memory dies having more consolidated heat credit points than those of logical metablock 2. In contrast, at higher temperatures of the storage device 102, 802, the controller may store data in logical metablock 2 816, since the blocks of logical metablock 2 may be less affected by thermal energy from the ASIC 810 than the blocks of logical metablock 1 due to their farther location from the ASIC 810.

In one example, the logical metablock may be one of N types of logical metablocks each associated with a different heat level, and the memory dies associated with the logical metablock may each be associated with a same heat level, wherein N>1. For instance, in the example of FIG. 8, the controller may segregate memory dies into pools of hot dies having heat level 4, warm-hot dies having heat level 3, warm-cold dies having heat level 2, and cold dies having heat level 1 (i.e., N=4), and so the controller may form 4 types of logical metablocks respectively from physical blocks in each pool. In other examples, the controller may segregate memory dies at the very least into pools of hot dies (or warm-hot dies) and cold dies (or warm-cold dies) (i.e., N=2). A logical metablock associated with cold/warm-cold dies or cold/warm-cold blocks may be referred to as a Type 1 logical metablock, while a logical metablock associated with hot/warm-hot dies or hot/warm-hot blocks may be referred to as a Type 2 logical metablock. Thus in the example of FIG. 8, logical metablock 1 814 may be a Type 2 logical metablock, while logical metablock 2 816 may be a Type 1 logical metablock.

In one example, the controller (e.g., the logical metablock module 1006) may be further configured to apply different CVD parameters for the N types of logical metablocks. For instance, referring to the Figures, the controller may apply different CVD logic for Type 1 logical metablocks than for Type 2 logical metablocks (where N=2 in this example). For example, due to the higher heat level of the hot blocks in Type 2 logical metablocks than the cold blocks in Type 1 logical metablocks, the controller 123 may track the CVD of the hot blocks to ensure that a given word line in each hot block assigned to a logical metablock may be read using the same read voltage, while the controller may not track the CVD of the cold blocks since ensuring the read voltages are the same across cold blocks may not be as important as for hot blocks. Alternatively, the controller may track the CVD of the cold blocks to identify different read voltage parameters to apply than those applied for hot blocks. For instance, when tracking CVDs of cold blocks and hot blocks, the controller may determine different sense values corresponding to read voltages, different error counts, different bit error rate counts, and the like due to the difference in CVDs resulting from heat differences across the respective block pools. As a result, the controller may apply different parameters (e.g., read voltage threshold offsets) for the cold blocks in logical metablock 2 816 and the hot blocks in logical metablock 1 814 accordingly.

In one example, the controller (e.g., the logical metablock module 1006) may be further configured to relocate data in the logical metablock during garbage collection from a source block associated with a heat level to a destination block associated with a same heat level, the heat level being different for each of the N types of logical metablocks. For instance, referring to the Figures, the controller may apply different GC logic for Type 1 logical metablocks than for Type 2 logical metablocks (where N=2 in this example). For example, the controller may apply one GC context for the hot blocks in Type 2 logical metablocks in which data is relocated from one or more hot source blocks to a hot destination block, and the controller may apply another GC context for cold blocks in Type 1 logical metablocks in which data is relocated from one or more cold source blocks to a cold destination block. Thus, the hot block pool for Type 2 logical metablocks includes its own source and destination blocks for GC, while the cold block pool for Type 1 logical metablocks includes its own source and destination blocks for GC.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a plurality of memory dies each including a physical block; and
   a controller configured to generate a mapping of heat levels to the physical blocks and to form a logical metablock from the physical blocks based on the mapping, the mapping being generated during storage device fabrication based on a location of each of the physical blocks with respect to the controller.

2. The storage device of claim 1, wherein the controller is further configured to obtain heat credit points associated with each of the physical blocks, and to form the logical metablock based on the heat credit points.

3. The storage device of claim 1, wherein one of the memory dies includes a plurality of physical blocks, and the controller is further configured to obtain heat credit points associated with each of the physical blocks of the one of the memory dies, to consolidate the heat credit points, and to form the logical metablock based on the consolidation.

4. The storage device of claim 3, wherein the controller is further configured to select multiple ones of the memory dies for forming the logical metablock based on the consolidation.

5. The storage device of claim 1,
wherein the controller is further configured to form the logical metablock based on first heat credit points associated with one of the memory dies, and to form a second logical metablock based on second heat credit points associated with each of a plurality of other memory dies,
wherein the first heat credit points and the second heat credit points indicate different heat levels.

6. The storage device of claim 5, wherein the logical metablock and the second logical metablock are each associated with a different quality of service (QOS).

7. The storage device of claim 5, wherein the controller is further configured to store source data for data computations in the logical metablock in response to the first heat credit points indicating a lower heat level than the second heat credit points.

8. A storage device, comprising:
a plurality of memory dies each including a plurality of physical blocks; and
a controller configured to obtain a mapping of heat levels to the physical blocks during storage device fabrication based on a proximity of each of the physical blocks to the controller, to form a first logical metablock from multiple ones of the physical blocks based on the mapping of a first heat level associated with one of the memory dies, and to form a second logical metablock from other multiple ones of the physical blocks based on the mapping of a second heat level associated with another one of the memory dies, wherein the first heat level is different than the second heat level.

9. The storage device of claim 8, wherein the controller is further configured to apply different cell voltage distribution (CVD) parameters for the first logical metablock and the second logical metablock in response to the first heat level being different than the second heat level.

10. The storage device of claim 8,
wherein the controller is further configured to relocate first data in the first logical metablock from a first source block to a first destination block during a first garbage collection, and to relocate second data in the second logical metablock from a second source block to a second destination block during a second garbage collection,
wherein the first source block and the first destination block are associated with the first heat level, and the second source block and the second destination block are associated with the second heat level.

11. The storage device of claim 8, wherein the controller is further configured to relocate data in the first logical metablock from a source block to a destination block during garbage collection, and the source block and the destination block are associated with different heat levels.

12. The storage device of claim 8,
wherein the controller is further configured to consolidate heat credit points associated with each of the physical blocks in the one of the memory dies during a download and execute (DLE) time of the storage device, and to form the logical metablock based on the consolidation.

13. The storage device of claim 12, wherein the controller is further configured to obtain a mapping of the heat credit points to each of the multiple physical blocks during the DLE time.

14. A storage device, comprising:
a plurality of memory dies each including a plurality of physical blocks; and
a controller configured to obtain and store a mapping of heat credit points to each of the physical blocks during storage device fabrication based on a location of the each of the physical blocks with respect to the controller, and to form a logical metablock from multiple ones of the physical blocks based on the mapping.

15. The storage device of claim 14, wherein the controller is further configured to modify the mapping during a runtime of the storage device.

16. The storage device of claim 14,
wherein the controller is further configured to form the logical metablock from the multiple ones of the physical blocks based on first heat points associated with one of the memory dies, and to form a second logical metablock from other multiple ones of the physical blocks based on second heat points associated with another one of the memory dies,
wherein the first heat points is lesser than the second heat points.

17. The storage device of claim 14,
wherein the controller is further configured to store data in one of the physical blocks associated with lesser heat points in response to a greater temperature of the storage device;
wherein the controller is further configured to store the data in a different one of the physical blocks associated with greater heat points in response to a lesser temperature of the storage device.

18. The storage device of claim 14, wherein the logical metablock is one of N types of logical metablocks each associated with a different heat level, and the memory dies including the multiple ones of the physical blocks from which the logical metablock is formed are each associated with a same heat level, wherein N>1.

19. The storage device of claim 18, wherein the controller is further configured to apply different cell voltage distribution (CVD) parameters for the N types of the logical metablocks.

20. The storage device of claim 18, wherein the controller is further configured to relocate data in the logical metablock during garbage collection from a source block associated with a heat level to a destination block associated with a same heat level, the heat level being different for each of the N types of the logical metablocks.

* * * * *